United States Patent [19]
Gardner et al.

[11] Patent Number: 6,147,004
[45] Date of Patent: Nov. 14, 2000

[54] JET VAPOR REDUCTION OF THE THICKNESS OF PROCESS LAYERS

[75] Inventors: Mark I. Gardner, Cedar Creek; Mark C. Gilmer, Austin, both of Tex.

[73] Assignee: Advanced Micro Devices, Inc., Austin, Tex.

[21] Appl. No.: 09/120,056

[22] Filed: Jul. 21, 1998

[51] Int. Cl.$^7$ .................................................. H01L 21/00
[52] U.S. Cl. ........................ 438/706; 156/345; 438/724; 438/726
[58] Field of Search ..................... 438/758, 765, 438/706, 710, 712, 726, 724, 748, 744; 216/57, 58, 66, 92; 156/345 LS, 345 P

[56] References Cited

U.S. PATENT DOCUMENTS

| | | | |
|---|---|---|---|
| 4,681,776 | 7/1987 | Bok ........................................ | 216/58 X |
| 4,900,395 | 2/1990 | Syverson et al. ....................... | 438/706 |
| 5,110,407 | 5/1992 | Ono et al. ............................... | 156/345 X |
| 5,127,984 | 7/1992 | Hua et al. ................................ | 438/748 |
| 5,423,940 | 6/1995 | Chen et al. ............................. | 156/345 X |
| 5,597,495 | 1/1997 | Keil et al. ............................... | 156/345 X |
| 5,874,366 | 2/1999 | Sporer et al. ........................... | 216/92 X |

*Primary Examiner*—William Powell
*Attorney, Agent, or Firm*—Williams, Morgan & Amerson, P.C.

[57] ABSTRACT

The present invention is directed to a method and apparatus for reducing the thickness of a process layer. The method comprises generating a relatively high velocity gas stream comprised of active ions that will react with the process layer, and moving the wafer relative to the nozzle to effect a reduction in the thickness of the process layer. The apparatus is comprised of a process chamber, means for securing a wafer in the chamber, a nozzle having an exit that is substantially the same width as the diameter of the wafer positioned in the chamber. The apparatus further comprises a means for moving the wafer relative to the nozzle.

33 Claims, 4 Drawing Sheets

JET VAPOR REDUCTION OF THE THICKNESS OF PROCESS LAYERS

BACKGROUND OF THE INVENTION

1. Field of the Invention

The present invention is generally directed to the field of semiconductor processing, and, more particularly, to reducing the thickness of previously-formed process layers.

2. Description of the Related Art

Within the semiconductor industry there is a constant drive to reduce the feature size of semiconductor devices, e.g., transistors. Reductions in feature size may lead to increased performance of the device, i.e., it may operate at greater speeds. Additionally, reducing the feature size of the semiconductor devices may increase profitability, in that, all other things being equal, smaller feature sizes may result in more chips being manufactured on the same size substrate or wafer.

As feature sizes are reduced, e.g., as channel lengths are reduced, a corresponding reduction in size or scaling of other parts of the semiconductor device may also be required. For example, in metal oxide field effect transistors, the thickness of the gate insulation layer may have to be reduced to optimize the performance of the semiconductor device. However, in forming a process layer, such as a gate insulation layer, modern forming methods and devices may not be able to directly form the process layers as thin as is desirable for the finished semiconductor device. Thus, there is a need for a method and apparatus that may be used to reduce the thickness of the previously-formed process layers.

The present invention is directed to a semiconductor device that solves some or all of the aforementioned problems and a method for making same.

SUMMARY OF THE INVENTION

The present invention is directed to a method and apparatus for reducing the thickness of a process layer. The method is comprised of positioning a wafer in proximity to a nozzle, the wafer having a process layer positioned thereon. The method further comprises generating a gas stream through the nozzle such that the stream exits the nozzle at a velocity ranging from approximately 100–1200 feet per second, and moving the wafer, and accordingly the process layer, relative to the nozzle. The gas stream is comprised of active ions that will react with the process layer and thereby reduce the thickness of the process layer.

The apparatus is comprised of a process chamber, a means for securing a wafer within the chamber, the wafer having a process layer positioned thereon. The apparatus further comprises a nozzle coupled to the process chamber, the nozzle has an exit that is substantially the same width as the diameter of the wafer positioned in the process chamber. The apparatus further includes a means for moving the wafer relative to the nozzle.

The apparatus further comprises a nozzle for use in reducing the thickness of a process layer positioned on a wafer. The nozzle is comprised of a housing that is adapted for coupling to a process chamber, and at least one gas inlet in fluid communication with the nozzle. The nozzle further comprises an exit that is at least substantially as wide as the diameter of the wafer.

BRIEF DESCRIPTION OF THE DRAWINGS

The invention may be understood by reference to the following description taken in conjunction with the accompanying drawings, in which like reference numerals identify like elements, and in which.

Figure 1:
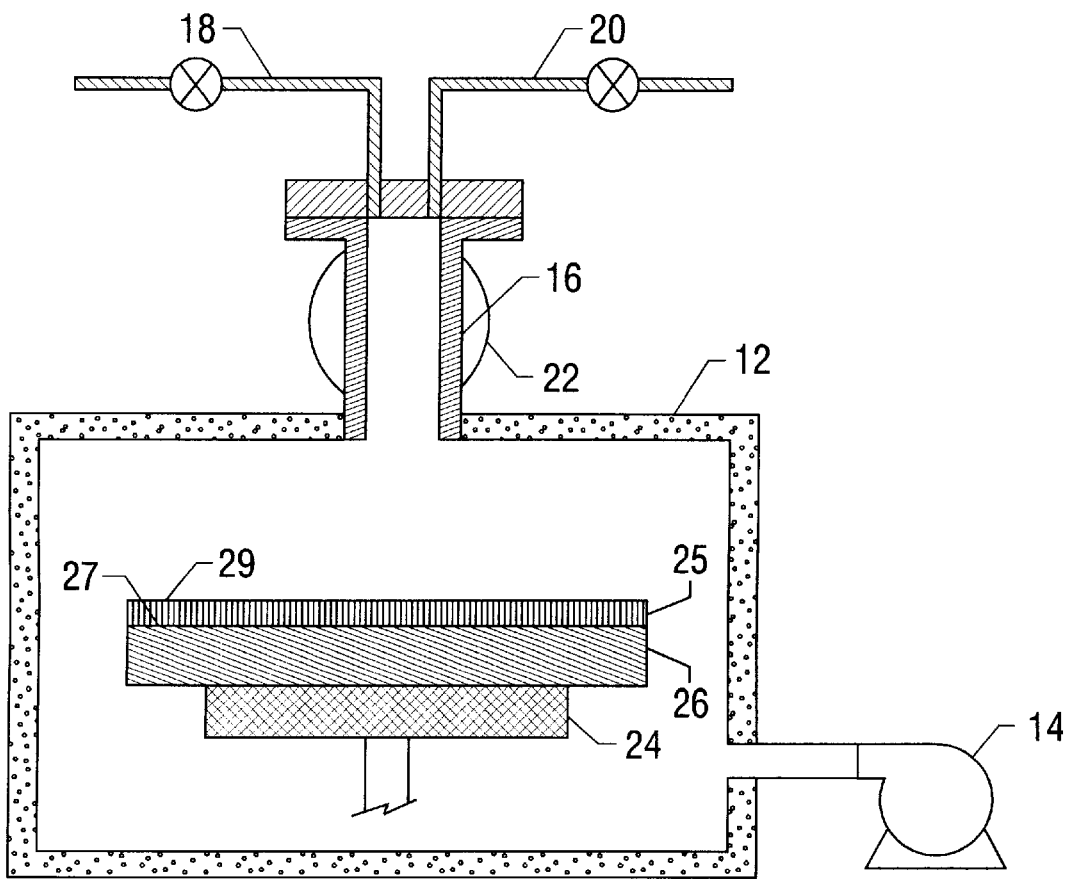
FIG. 1 is a cross-sectional, schematic view of an apparatus of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

One embodiment of a jet vapor reduction apparatus 10 is shown in FIG. 1. The apparatus 10 may be comprised of a process chamber 12, a vacuum pump 14, a nozzle 16, a diluting gas inlet 18, a removal gas inlet 20, a microwave cavity 22, and a wafer chuck 24. The nozzle 16 may be any of a variety of configurations, as will become apparent upon a complete reading of the entire specification. Illustrative embodiments of the nozzle 16 are disclosed more fully below. Additionally, although the diluting gas inlet 18 and removal gas inlet 20 are depicted as single lines, those skilled in the art will recognize that the diluting gas inlet 18 and/or the removal gas inlet 20 may be comprised of multiple inlets. Moreover, separate inlet lines for the diluting gas and the removal gas may not be used. Rather, the diluting gas (if used) and the removal gas may be mixed together and then supplied to the nozzle 16 via a single inlet line. Of course, other configurations may be possible for supplying the removal gas and, if used, the diluting gas to the nozzle 16. The location of the nozzle exit relative to a surface 29 of a process layer 25 may vary, and, in one embodiment, may vary from approximately 0.5–5.0 inches. Moreover, although the nozzle 16 is depicted herein as being positioned approximately perpendicular to the surface 29 of the process layer 25, the nozzle 16 may be positioned such that the gas exiting the nozzle impacts the surface 29 of the process layer 25 at an angle.

As shown in FIG. 1, a wafer 26 may be positioned on the wafer chuck 24. The wafer 26 may be secured to the wafer chuck 24 by a variety of means, such as by a mechanical clamp or by a vacuum. As will be appreciated by those skilled in the art, the wafer 26 may have a plurality of process layers (not shown) formed above a surface 27 of the wafer 26. One such illustrative process layer 25 is shown in FIG. 1. In general, the jet vapor reduction apparatus 10 may be used to reduce the thickness of the illustrative process layer 25 as the wafer 26 is passed under a stream of relatively high speed removal gas exiting from nozzle 16. The process is continued until the process layer 25 has been reduced to its desired final thickness, as determined by, for example, an ellipsometer or timer. The details of this process are discussed more fully below.

In one embodiment, the present invention may be practiced through use of one of the devices employed in a traditional jet nitride deposition process. One such device is a jet vapor deposition apparatus sold by Jet Vapor Deposition Company under the model number JVD-100. In general, the present invention may be practiced using that apparatus with appropriate changes to various process parameters, such as the gas injected into the process chamber 12, the speed of movement of the wafer, etc., as will be more fully described below. The present invention may also be practiced in a jet vapor reduction apparatus 10 employing a novel design for the nozzle 16, as will be described more fully below.

In operation, the wafer 26 is secured to the wafer chuck 24. Thereafter, the vacuum pump 14 is used to establish a vacuum in the process chamber 12. In one embodiment, a vacuum of approximately $10^{-7}$ Torr is established in the process chamber 12. Thereafter, a removal gas may be introduced into the process chamber 12 via the removal gas inlet 20 and the nozzle 16. The gas selected as the removal gas will vary depending upon, for example, the composition of the process layer 25 to be reduced by the present process. The removal gas should contain an active ion that will react with the process layer 27 to thereby reduce the thickness of the process layer 25.

For example, if the previously-formed process layer 25 is comprised of silicon nitride ($SiN_3$), the removal gas may be comprised of hydrogen fluorine (HF) or nitrogen fluoride ($NF_3$). The active fluorine ions react with the silicon nitride process layer to form silicon hexafluoride ($SiF_6$), thereby reducing the thickness of the deposited layer of silicon nitride. The present invention may also be used to reduce the thickness of previously-deposited layers of metal. For example, if the previously-formed process layer 25 is comprised of, for example, aluminum (Al), the removal gas may be comprised of, for example, chlorine ($Cl_2$). The active chlorine ions will react with the aluminum process layer to form aluminum chloride ($AlCl_2$) which will reduce the thickness of the previously-formed layer of aluminum. Thus, as will be readily appreciated to those skilled in the art, the novel method disclosed herein may be used to reduce the thickness of the process layers 25 formed from a vast variety of materials.

In one embodiment, the removal gas may be supplied to the nozzle 16 at a pressure of approximately 60–80 psi and at approximately ambient temperature. The exact process parameters for the removal gas are matters of design choice that may vary depending upon the particular application. Although not required, the removal gas may be combined with a diluting gas, for example, nitrogen ($N_2$) or argon (Ar), that is introduced into the process chamber 12 via the diluting gas inlet 18 and the nozzle 16. The removal gas, e.g., HF, $NF_3$ or $Cl_2$, may be diluted to result in a concentration that may range from 100:1 to 1000:1. The dilution of the removal gas, if any, may be varied as a matter of design choice or as required by a particular application. In general, all other things being equal, the more the removal gas is diluted, the slower the removal rate of the process layer 25. Conversely, the more concentrated the removal gas, the faster the removal rate of the process layer 25. Of course, the concentration of the removal gas may be varied throughout any particular process, e.g, a higher concentration of removal gas may be used to obtain initially high removal rates followed by a lower concentration for a slower removal rate.

The combined flow rate of the removal gas and the diluting gas may range from approximately 0.5–2 liters per minute. The nozzle 16 is designed and configured such that the velocity of the gas stream exiting the nozzle 16 is at a speed ranging from approximately 100 ft/sec to supersonic speeds, e.g., speeds above approximately 1120. In one illustrative embodiment, the gas flow rates and the design of the nozzle 16 are such that the velocity of the gas stream as it exits the nozzle 16 is somewhat below the supersonic range, for example, the exit velocity may range from approximately 400–1000 ft/sec. Of course, the exact speed that the gas stream exits the nozzle 16 is a matter of design choice that may be varied depending upon the particular application under consideration. In general, all other things being equal, the greater the exit velocity of the gas stream, the faster the removal rate of the illustrative process layer 25. Conversely, the slower the velocity of the gas stream, the slower the removal rate of the illustrative process layer 25.

A microwave generator (not shown) and the associated microwave cavity 22 may be used to generate a plasma field that may be useful, in appropriate circumstances, to free the active ions in the removal gas. For example, if nitrogen fluoride ($NH_3$) is used as the removal gas, a high energy plasma may be required to break the fluoride away from the nitrogen. A standard microwave generator may be used to generate an energy field of approximately 10–15000 watts to generate the plasma used to disassociate the fluoride from the nitrogen. However, the microwave cavity 22 and associated microwave generator (not shown) may not be required on all applications using the jet vapor reduction apparatus 10. For example, if hydrogen fluoride (HF) is used as the removal gas, then the microwave cavity 22 and microwave generator may not be required.

Although not required, a means may be provided to heat and/or cool the process layer 25 before or during the reducing process. The temperature to which the process layer 25 is heated or cooled is a matter of design choice and the desired rate of removal of the process layer 25. In 1general, the higher the temperature of the process layer 25, the faster the removal rate of the process layer 25. Conversely, the lower the temperature of the process layer 25, the slower the removal rate of the process layer 25. In one embodiment, the temperature of the process layer 25 may be varied between approximately 10–200° C. Of course, as is readily apparent to those skilled in the art, the temperature of the process layer 25 may be varied throughout the reduction process. For example, in an initial pass, the temperature of the process layer 25 may be maintained at a relatively high temperature to increase the rate at which the illustrative process layer 25 is removed. Thereafter, the temperature of the process layer 25 may be regulated to a relatively low temperature, e.g., ambient temperature, to slow the rate of removal of the illustrative process layer 25. Such a technique may allow rapid removal of the bulk of the portion of the process layer 25 to be removed, yet still allow for a final removal pass at a more controllable, slower removal rate to obtain the final desired thickness of the process layer 25. Of course, the removal of the process layer 25 does not have to be accomplished in multiple passes, it may be accomplished in a single pass under an appropriately configured nozzle 16.

Figure 2:
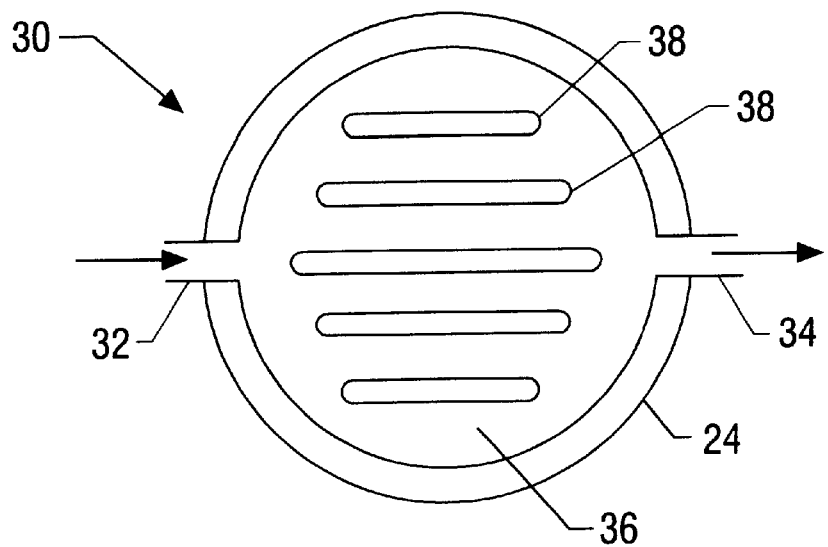
FIG. 2 is a cross-sectional view of an illustrative circulating fluid system that may be used with the present invention.

In one illustrative embodiment, the heating/cooling of the process layer 25 may be accomplished by having a circulating fluid system 30 that may be embedded in, or attached to the wafer chuck 24. As shown in FIG. 2, the circulating fluid system 30 may have a fluid inlet 32 and a fluid outlet 34. To cool the process layer 25, a cooling fluid, such as a chilled glycol solution, may be circulated through the circulating fluid system 30 at a rate and temperature sufficient to cause the process layer 25 to reach the desired temperature. Similarly, to heat the process layer 25, a hot fluid may be circulated through the circulating fluid system 30. The details of construction of the circulating fluid system 30 are matters of design choice. For example, the circulating fluid system 30 may be comprised of a cavity 36 and a plurality of baffles 38 formed in the wafer chuck 24. Alternatively, the baffles 38 could be omitted resulting in a cavity 36 in the wafer chuck 24 through which the heating/cooling fluid could be circulated. Of course, the circulating fluid system 30 described herein is only one illustrative example of a means that may be used to heat or cool the process layer 25. For example, an electrical grid or wire (not shown) embedded or coupled to the wafer chuck 24 could be used to heat the process layer 25 by resistance heating.

As generally described above, the jet vapor reduction apparatus 10 is designed such that the wafer 26, and therefore the process layer 25, may be passed under the nozzle 16 as a gas comprised of active ions is exiting the nozzle 16 at a relatively high speed. The exact means that is used to move the wafer 26 relative to the nozzle 16 is a matter of design choice. In one embodiment, the wafer transport mechanism used in a traditional jet vapor nitride deposition system, such as the Model No. JVD-100, sold by Jet Vapor Deposition Company (not shown), may be used to move the wafer 26 relative to the nozzle 16. Of course, any other automated or robotic mechanism for moving the wafer 26 may be acceptable. Whatever mechanism is selected to move the wafer 26, the wafer 26 should normally move at a rate of between approximately 10–200 ft/min relative to the nozzle 16. In general, increasing the rate at which the process layer 25 is moved under the jet nozzle 16 will decrease the amount of process layer 25 removed by the process. Conversely, the slower the process layer 25 is moved under the nozzle 16, the greater the amount of the process layer 25 removed by the process. Thus, for removing large amounts of an initially thick process layer 25, the wafer speed relative to the nozzle 16 should be relatively slow. Conversely, to remove a very thin portion of a process layer 25, e.g., when forming a very thin gate insulation layer, it may be desirable to move the process layer 25 as fast as possible under the nozzle 16. Current jet nitride deposition systems employ wafer transport systems using stepper motors, thus, the speed of the wafer movement within these systems is at the lower end of the above range. In order to achieve the upper end of the above range, a system comprised of servo motors and feedback control would be required. As is readily apparent to those skilled in the art, the movement of the wafer 26 as compared to the nozzle 16 is relative movement. That is, the nozzle 16 could be moved relative to a stationary wafer 26.

As stated previously, the present invention may be used to reduce the thickness of a variety of process layers, irrespective of where or how they are formed. The present invention may be practiced in a separate piece of processing equipment, whose use is directed solely to the jet vapor reduction process disclosed herein, or, alternatively, the present method may be practiced in an existing process apparatus. For example, after a layer of silicon nitride has been formed in a jet vapor deposition apparatus, the thickness of the deposited layer of silicon nitride may be reduced using the same apparatus used in the jet vapor deposition process. Of course, the appropriate gas connections would have to be made to establish the flow of removal gas and diluting gas, and, if desired, the flow of cooling/heating fluid to the fluid circulating system 30 would be started.

Figure 3:
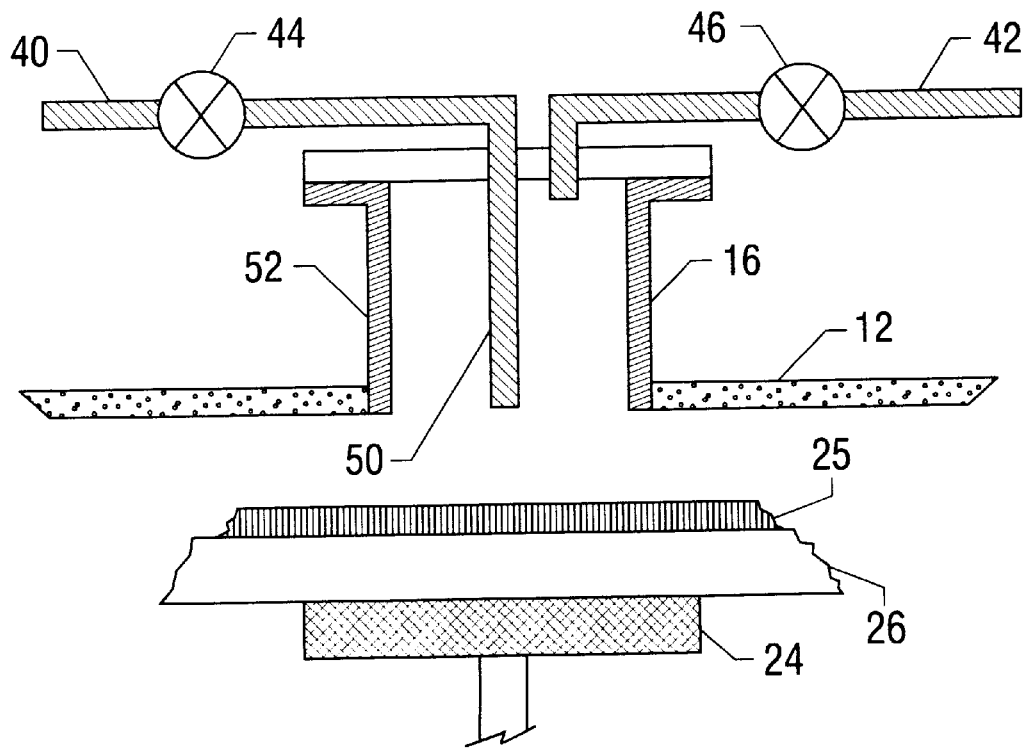
FIG. 3 is a cross-sectional, schematic view of an illustrative nozzle that may be used with the present invention.

In one illustrative example using an existing jet vapor deposition apparatus, such as the Model No. JVD-100 referenced above (not shown), the nozzle 16 would be a co-axial dual-nozzle jet as shown in FIG. 3. Nozzle 16 is comprised of removal gas inlet 40, diluting gas inlet 42, and a plurality of valves 44, 46. Nozzle 16 is in fluid communication with the process chamber 12. The wafer 26 is positioned on wafer chuck 24. The nozzle 16 is comprised of an inner tube 50 and an outer tuber 52. In one illustrative embodiment, the diameter of outer tube 52 is approximately 6 mm, while the diameter of inner tube 50 is approximately 3 mm. This nozzle configuration would result in a gas stream that may vary between 3–10 mm in diameter. If the present invention is employed in this type of existing jet vapor deposition apparatus, then it will be necessary to raster scan the process layer 25 relative to the nozzle 16. As will be readily apparent to those skilled in the art, in doing so, it will be necessary to slightly overlap exiting passes, for example, by approximately 10%, such that complete removal of the desired amount of the process layer 25 is insured. Using this technique and apparatus, the wafer 26 will be raster scanned underneath the nozzle 16 until the desired amount of the process layer 25 is removed.

Figure 4:
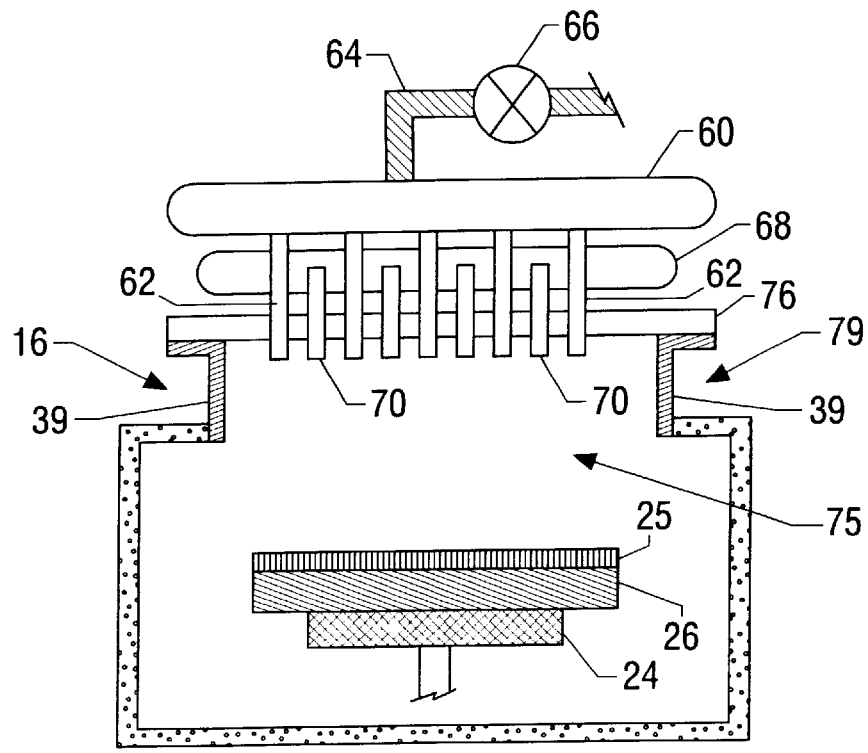
FIG. 4 is a cross-sectional, schematic view of another illustrative nozzle that may be used with the present invention.
Figure 5:
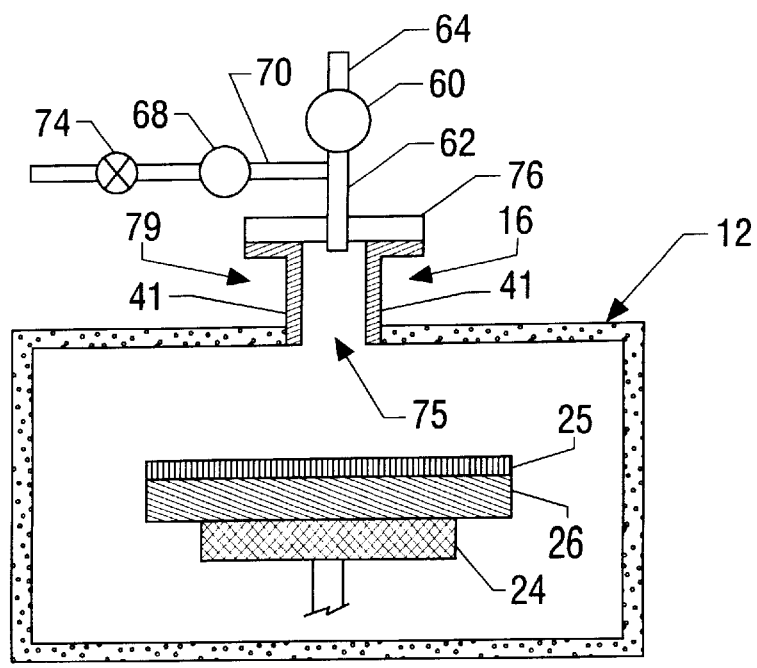
FIG. 5 is a cross-sectional side view of the nozzle shown in FIG. 4.

An alternative embodiment of a nozzle 16 that may be used with the present invention is shown in FIGS. 4 and 5. As shown therein, a wafer 26, having a process layer 25 formed thereon, is positioned on a wafer chuck 24 within process chamber 12. As shown in the drawings, the nozzle 16 is comprised of a housing 79 comprised of, for example, a plurality of sidewalls 39, 41. Of course, the sidewalls 39, 41 of the nozzle 16 may be constructed so as to diverge or converge with respect to one another. Additionally, the nozzle 16 may be positioned such that gas exiting the nozzle 16 impacts the surface 29 at something other than the substantially perpendicular angle depicted in FIGS. 4 and 5. The nozzle 16 is sized such that it is at least substantially the same width as the process layer 25 to be removed. The width of the nozzle 16 may be such that it is slightly greater than the diameter of the wafer 26 and, thus, the process layer 25. Of course, if desired, the nozzle configuration depicted in FIGS. 4 and 5 may have a width that is somewhat less than the diameter of the wafer 26, e.g., 85% of the diameter of the wafer 26. Through use of a nozzle 16 having a width that is at least substantially as wide as the wafer 26 and, thus, the process layer 25, the thickness of a process layer 25 may be reduced without having to raster scan the process layer 25 relative to the nozzle 16. Of course, with the nozzle configuration depicted in FIGS. 4 and 5, one or more passes may be used to achieve the final desired thickness of the process layer 25.

The nozzle 16 should be designed such that there is uniform distribution of the removal gas and, if used, the diluting gas as the gas stream exits the nozzle 16. In one embodiment, this may be achieved though use of a removal gas header 60, a plurality of removal gas outlets 62, a removal gas inlet 64, and a valve 66. The nozzle 16 may further be in fluid communication with a diluting gas header 68, a plurality of diluting gas outlets 70, a diluting gas inlet 72, and a valve 74. The removal gas outlets 62 and diluting gas outlets 70 may penetrate a flange 76. The precise number, size, configuration and location of the removal gas outlets 62 and diluting gas inlets 72 are matters of design choice and may vary depending upon a variety of process parameters, such as the type, pressure flow rate and temperature of the removal gas and diluting gas used, the material and thickness of the process layer 25 to be removed, the desired rate at which material is removed from the process layer 25, etc. In general, the nozzle 16 should be designed such that there is uniform flow of the removal gas and, if used, diluting gas.

Figure 6:
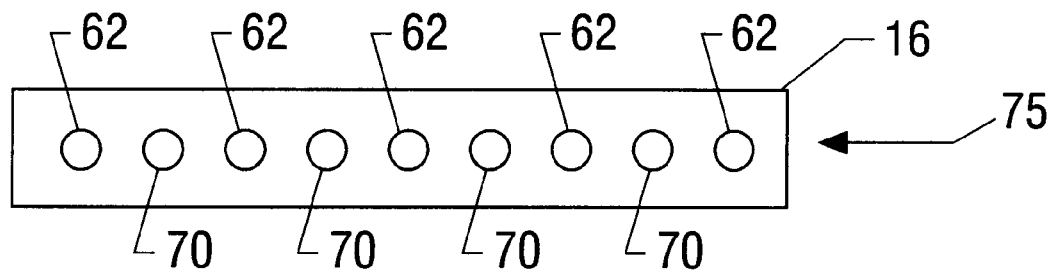
FIG. 6 is a cross-sectional view of an illustrative nozzle of the present invention having a generally rectangular cross-section.
Figure 7:
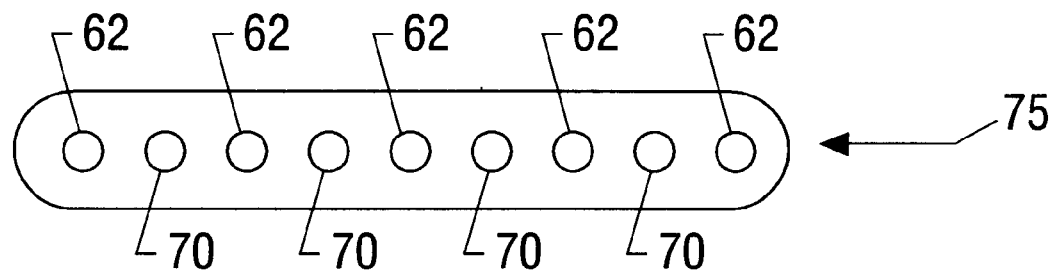
FIG. 7 is a cross-sectional view of an illustrative nozzle of the present invention having a generally oval cross-section.

As shown in FIG. 6, the outlet 75 of the nozzle 16 may have a generally rectangular configuration. In one illustrative embodiment, designed for use with wafers approximately 8" in diameter, the outlet 75 of the nozzle 16 may be approximately 10 inches wide and 3 inches in length. Of course, the outlet 75 of the nozzle 16 could be of any desired size. Alternatively, the outlet 75 of nozzle 16 could have a generally oval configuration as shown in FIG. 7. Irrespective of the size and configuration of the nozzle 16, it is desirable that the nozzle be at least substantially the same width, or slightly greater than the width of the wafer 26 on which semiconductor devices are to be made. Thus configured, a process layer 25 formed above the entire surface of the wafer 26 may be removed, if desired, in a single pass or in multiple passes without the need for raster scanning the nozzle 16 relative to the wafer. Of course, the width of the nozzle 16 may vary depending on the size of the wafer that will be subjected to the present process, e.g., if larger wafers are used, the width of the outlet 75 of the nozzle 16 may also be increased. For example, for 12" diameter wafers, the outlet 75 of the nozzle 16 may be approximately 14 inches wide.

As will be readily apparent to those skilled in the art, the present invention may be used to reduce the thickness of a variety of previously-formed layers used in making semiconductor devices, e.g., oxide layers, metal layers, nitride layers, polysilicon layers, glass layers, etc. Moreover, the present invention may be employed as a stand-alone process through which wafers will be processed on a batch or wafer basis. Alternatively, the present process may be employed as a later process step in existing processing equipment, e.g., jet vapor nitride deposition followed by the reduction of the thickness of the deposited nitride layer without removing the wafer from the process chamber.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for reducing the thickness of a process layer, comprising:

positioning a wafer in proximity to a nozzle, said wafer having a process layer positioned on said wafer;

generating a gas stream through said nozzle that exits said nozzle at a speed ranging from approximately 100–1200 feet per second, said gas stream comprised of active ions that will react with said process layer to form a gas; and moving said wafer relative to said nozzle.

2. The method of claim 1, wherein said step of generating a gas stream comprises combining a removal gas with a diluting gas.

3. The method of claim 1, further comprising generating a plasma field and passing at least a portion of said gas stream through said plasma field.

4. The method of claim 1, wherein moving said wafer relative to said nozzle comprises raster scanning said nozzle relative to said wafer.

5. The method of claim 1, further comprising reducing the thickness of the entirety of said process layer in a single pass as said wafer is moved relative to said nozzle.

6. The method of claim 1, wherein moving said wafer relative to said nozzle comprises actuating at least one electric motor.

7. The method of claim 1, wherein generating a gas stream through said nozzle comprises supplying a gas stream at approximately 60–80 pounds per square inch.

8. The method of claim 2, wherein combining a removal gas with a diluting gas comprises combining a removal gas with a diluting gas to result in a concentration of diluting gas relative to said removal gas of approximately 100:1 to 1000:1.

9. The method of claim 1, wherein moving said wafer relative to said nozzle comprises moving said wafer at a speed of approximately 10–200 feet per second relative to said nozzle.

10. The method of claim 1, wherein said process layer is comprised of silicon nitride and generating said gas stream is comprised of generating a gas stream comprised of active fluorine ions.

11. The method of claim 1, further comprising controlling the temperature of said process layer.

12. The method of claim 1, wherein said process layer is comprised of aluminum and generating said gas stream is comprised of generating a gas stream comprised of active chlorine ions.

13. The method of claim 2, wherein said process layer is comprised of silicon nitride and combining said removal gas with a diluting gas comprises combining hydrogen fluorine or nitrogen fluoride with nitrogen or argon.

14. A method for reducing the thickness of a process layer, comprising:

positioning a wafer in proximity to a nozzle, said wafer having a process layer positioned on said wafer;

generating a gas stream through said nozzle that exits said nozzle at a speed ranging from approximately 100–1200 feet per second, said gas stream comprised of active ions that will react with said process layer to form a gas; and moving said wafer at a speed of approximately 10–200 feet per second relative to said nozzle.

15. The method of claim 14, wherein said step of generating a gas stream comprises combining a removal gas with a diluting gas.

16. The method of claim 14, further comprising generating a plasma field and passing at least a portion of said gas stream through said plasma field.

17. The method of claim 14, wherein moving said wafer relative to said nozzle comprises raster scanning said nozzle relative to said wafer.

18. The method of claim 14, further comprising reducing the thickness of the entirety of said process layer in a single pass as said wafer is moved relative to said nozzle.

19. The method of claim 14, wherein generating a gas stream through said nozzle comprises supplying a gas stream at approximately 60–80 pounds per square inch.

20. The method of claim 15, wherein combining a removal gas with a diluting gas comprises combining a removal gas with a diluting gas to result in a concentration of diluting gas relative to said removal gas of approximately 100:1 to 1000:1.

21. The method of claim 14, wherein said process layer is comprised of silicon nitride and generating said gas stream is comprised of generating a gas stream comprised of active fluorine ions.

22. The method of claim 14, wherein said process layer is comprised of aluminum and generating said gas stream is comprised of generating a gas stream comprised of active chlorine ions.

23. The method of claim 15, wherein said process layer is comprised of silicon nitride and combining said removal gas with a diluting gas comprises combining hydrogen fluorine or nitrogen fluoride with nitrogen or argon.

24. The method of claim 14, further comprising controlling the temperature of said process layer.

25. A method for reducing the thickness of a layer of silicon nitride, comprising:

positioning a wafer in proximity to a nozzle, said wafer having a layer of silicon nitride positioned on said wafer;

generating a gas stream through said nozzle at a speed ranging from approximately 100–1200 feet per second, said gas stream comprised of active fluorine ions that will react with said silicon nitride layer; and moving said wafer relative to said nozzle.

26. The method of claim 25, wherein generating said gas stream comprises generating a gas stream comprised of hydrogen fluorine or nitrogen fluorine.

27. The method of claim 25, wherein generating said gas stream comprises generating a gas stream comprised of active fluorine ions and a diluting gas.

28. The method of claim 25, further comprising generating a plasma field and passing at least a portion of said gas stream through said plasma field.

29. The method of claim 25, wherein moving said wafer relative to said nozzle comprises raster scanning said nozzle relative to said wafer.

30. The method of claim 25, further comprising reducing the thickness of the entirety of said process layer in a single pass as said wafer is moved relative to said nozzle.

31. The method of claim 25, wherein generating a gas stream through said nozzle comprises supplying a gas stream at approximately 60–80 pounds per square inch.

32. The method of claim 25, wherein combining a removal gas with a diluting gas comprises combining a removal gas with a diluting gas to result in a concentration of diluting gas relative to said removal gas of approximately 100:1 to 1000:1.

33. The method of claim 25, further comprising controlling the temperature of said process layer.

* * * * *